United States Patent [19]
Cao et al.

[11] Patent Number: 5,855,953
[45] Date of Patent: Jan. 5, 1999

[54] AEROGEL COMPOSITES AND METHOD OF MANUFACTURE

[75] Inventors: Wanqing Cao, Alameda; Arlon Jason Hunt, Oakland, both of Calif.

[73] Assignee: The Regents, University of California, Oakland, Calif.

[21] Appl. No.: 221,643

[22] Filed: Mar. 31, 1994

[51] Int. Cl.$^6$ ....................................... B05D 3/02
[52] U.S. Cl. .................. 427/226; 427/228; 427/244; 427/255.6; 427/294; 428/304.4; 428/305.5; 502/418
[58] Field of Search ................... 427/226, 228, 427/244, 255.1, 255.2, 255.3, 255.6, 294; 502/418; 428/304.4, 305.5

[56] References Cited

U.S. PATENT DOCUMENTS

| | | | |
|---|---|---|---|
| 2,093,454 | 9/1937 | Kistler | 252/6 |
| 4,610,863 | 9/1986 | Tewari et al. | 423/338 |
| 4,629,652 | 12/1986 | Carlson et al. | 427/180 X |
| 4,806,290 | 2/1989 | Hopper et al. | 264/28 |
| 4,873,218 | 10/1989 | Pekala | 502/418 |
| 4,997,804 | 3/1991 | Pekala | 502/418 |
| 5,260,855 | 11/1993 | Kaschmitter et al. | 361/502 |
| 5,306,445 | 4/1994 | Reed et al. | 252/646 |
| 5,314,857 | 5/1994 | Koontz | 502/258 |
| 5,336,274 | 8/1994 | Mayer et al. | 29/623.4 |
| 5,358,776 | 10/1994 | Hotaling | 428/304.4 |

FOREIGN PATENT DOCUMENTS 2141418  12/1984  United Kingdom .

*Primary Examiner*—Michael Lusignan
*Attorney, Agent, or Firm*—Kathleen DalBon; Paul R. Martin

[57] ABSTRACT

Disclosed herewith is a process of forming an aerogel composite which comprises introducing a gaseous material into a formed aerogel monolith or powder, and causing decomposition of said gaseous material in said aerogel in amounts sufficient to cause deposition of the decomposition products of the gas on the surfaces of the pores of the said aerogel.

Also disclosed are the composites made by the process.

16 Claims, No Drawings

AEROGEL COMPOSITES AND METHOD OF MANUFACTURE

This invention was made with Government support under Contract No. DE-AC03-76SF00098 between the U.S. Department of Energy and the University of California for the operation of Lawrence Berkeley laboratory. The Government has certain rights in this invention.

BACKGROUND OF THE INVENTION

1. Field of the Invention

The present invention relates to composite materials made using aerogel foam, and the process for the manufacture thereof. More particularly, the invention is based on the use and properties of aerogels.

Aerogels are open pore, low density solids (typically 5% solid) that are easily permeated by gases. Aerogels typically have a high surface area and can exhibit catalytic properties towards gas-phase reactions. Aerogels are made using sol-gel processing followed by supercritical extraction of the entrapped solvent. A combination of reacting fluids and solvents are mixed together and form a gel (a low density network of solids containing the solvents and liquid reaction products). To remove the solvent without destroying or altering the solid network, the gel is placed in a vessel and the temperature and pressure are raised above the critical point of the contained solvent. Thereafter the pressure is released. The resulting material is aerogel and is the starting point for this invention. Aerogels can be made of many materials including metal oxides, polymers, and carbon.

2. Description of Related Art

Aerogels are known in the art. For example, aerogels have been described in U.S. Pat. No. 4,610,863 and U.S. Pat. No. 2,093,454 (S. S. Kistler, 1937); and in various articles, i.e. Aerogels, appearing in Scientific American, May 1988, Vol. 256, No. 5.

The aerogels described in the prior art are transparent arrays which can be utilized, for example, in windows, refrigerators (as insulation or as insulating windows), ovens (as insulation or as insulating windows), or in the walls and doors thereof, or as the active material in detectors for analyzing high-energy elementary particles or cosmic rays.

The uses of the aerogels of the prior art are somewhat limited, because they do not possess characteristics desirable for certain uses. For example, they are structurally weak and friable, can be broken down by water, and require vacuum-packing to attain their highest thermal-insulation properties.

SUMMARY OF THE INVENTION

It is an object of this invention to provide improved aerogels for thermal insulation applications.

It is a further object of this invention to provide a process for fabricating such improved aerogels.

It is still another object of this invention to provide an improved process for manufacture of aerogel composites.

It is still another object of this invention to provide aerogel composites having a variety of physical characteristics suitable for a plurality of purposes.

Other objects and advantages of the invention will become readily apparent from the following description.

The present invention relates to a new method of introducing additional solid phases into aerogel by the decomposition of vapors, and to the aerogel composite products produced thereby. This method can be used to produce a variety of composite materials using various aerogel compositions and deposited phases. In particular, the method of this invention has been used to increase the thermal resistance and improve the strength of silica aerogel insulation by adding carbon to the aerogel. The carbon blocks infrared radiation transfer to substantially reduce the thermal conductivity of aerogel insulation. Other aerogel composites produced by this method exhibit photoluminescence (silicon in silica aerogel) and ferromagnetic, paramagnetic, or super-paramagnetic behavior (iron in silica aerogel).

The invention is a method to make new composite materials by introducing a gas into aerogel and using its high surface area and catalytic properties to decompose the gas to form a new solid phase in the aerogel network. The material produced in this way is unique in its structure and properties. Thermal decomposition of the gas within the aerogel generally takes place at significantly lower temperatures than it would in the free gas phase or on other solid surfaces. Thus the material preferentially deposits on the interior and surface of the aerogel to form a new composite.

DESCRIPTION OF THE INVENTION

A number of hydrocarbon gases and vapors have been decomposed in the aerogel to produce carbon-silica composites. We have demonstrated the catalyzed decomposition of methane, natural gas, commercial propane, acetylene, and vapors of xylene and furfuryl alcohol. The decomposition takes place at temperatures 100° to 500° C. lower than it would without the aerogel present. The decomposition usually takes place only in the aerogel and not elsewhere. Methane decomposition takes place in untreated aerogel at about 850° C., xylene at 450° C., and furfuryl alcohol at 350° C.

The rate of carbon deposition depends on the choice of gas and temperature. When deposition temperature is low ($\leq 500°$ C.), further heat treatment (550°–650° C.) in an inert atmosphere is necessary in order to completely convert the deposited material to pure carbon. This conversion is useful to maximize the absorption of carbon for a given loading of carbon in aerogel. Small amounts of carbon (2–20%) deposited using this method can increase the thermal resistance for evacuated aerogel from R-20/inch to R-35/in or more. In non-evacuated aerogel the thermal resistance can be increased from R-8/in to R-11/in or more. Aerogel weights have been increased up to ten times the original weight by the deposition of carbon, which may be of use in applications other than insulation. Deposition times vary from a few minutes to more than 48 hours. After deposition, breaking open the aerogel monolith reveals a uniform blackness throughout the volume indicating homogenous carbon deposition. Shorter deposition times result in aerogel composites suitable for thermal insulation. Long deposition times using natural gas or acetylene result in a dense graphite-like solid with considerably enhanced strength and resistance to attack by water (untreated silica aerogel is destroyed by liquid water). This material has a point to point electrical resistance as low as one ohm and potential uses in electrodes, batteries, and computers.

Aerogel composites of a variety of materials can be produced using the method of this invention. Silicon-silica composites were prepared by the catalytic decomposition of dilute silane gas followed by a post-deposition heat treatment to induce crystallinity in the silicon. The resulting composites photo luminesce when illuminated by ultraviolet radiation. The intensity and wavelength of the peak of the photoluminescent curve can be controlled by the method used in the post treatment process. The photoluminescence is believed to be due to quantum confinement effects originating from extremely small silicon crystallites. The silicon-silica composite should be useful in a variety of optoelectronic devices.

Composites of silica and iron, iron and carbon, and various oxides of iron can also be produced using the method of this invention. Ferrocene, $Fe(C_5H_5)_2$ infiltrated into aerogel is decomposed at temperatures as low as 100° C. to produce combined iron and carbon deposits and release hydrogen. Amorphous and crystalline deposits of carbon include graphite ring structures with diameters from 0.05–0.5 $\mu$gm. The resulting material can be heated in an oxidizing atmosphere to eliminate the carbon and produce an aerogel iron oxide composite. An iron oxide composite can be treated in a reducing atmosphere to produce deposits of metallic iron. Subsequent oxidation can induce several oxidation states of iron. The resulting composites exhibit ferromagnetic, paramagnetic, and possibly superparamagnetic properties.

Because aerogel effectively catalyzes gas phase decomposition, the method has applications much broader than the illustrative applications described above. In addition to silica aerogel, carbon or metal oxide aerogels can be used as the deposition matrix. For instance, decomposition of metal-carbonyl, organo-metallic, or any low-vapor-pressure compound or element can produce a variety of silica-metal, carbon-metal, silica-non-metal, carbon-non-metal, silica-semiconductor, or carbon-semiconductor composites. Other candidates include the gases and combinations of reactive or non-reactive gases used in chemical vapor deposition. By starting with aerogels made of differing materials, e.g. $Al_2O_3$, $TiO_2$, NiO, $ZrO_2$, or carbon, and introducing various gases for decomposition, a wide variety of composites can be produced. To enhance the process, the minimum temperature for vapor decomposition can be reduced by adding metal compounds during preparation of the aerogel in various ways. For example, dissolved nickel compounds can be added to the sol during preparation of silica alcogel before gelation. Nickel may also be added after gelation by soaking the gel in alcohol containing nickel compounds. After supercritical drying, these Ni-treated gels cause hydrocarbon gases to decompose at much lower temperatures than does untreated aerogel.

Aerogel composites with small amounts of deposited guest materials are likely to have the following characteristics: low thermal conductivity, high porosity and surface area, and intimate mixing of the aerogel and deposited material at a nanometer scale. Aerogels containing larger amounts of deposited material are likely to have the following characteristics: strength increased over that of the aerogel, lower porosity (50% or less), and high electrical conductivity, when deposited with metals or conducting solids.

Post treatments, such as infiltration of gases for deposition of additional or different materials or to induce chemical reactions, maturation under certain controlled conditions, or exposure to electromagnetic or other radiation, could result in composites with a variety of uses. In one example of a post treatment, infiltration of carbon-containing silica aerogel composites with Li could produce materials appropriate for electrochemical storage devices.

Because the guest phase is deposited as nanometer-sized matter, post treatment in a reactive atmosphere can produce nanometer-sized coatings on materials deposited earlier. Such composites have properties that depend on the dimensions of the particles initially deposited and those of the coating material. The properties of the nanometer-sized deposits can differ from those of the same material in bulk form because the individual particles are so small. This smallness may cause an interatomic spacing that differs from that of the bulk material, thereby altering the fundamental band structure. The small size of the deposited material may also induce quantum-confinement effects which result in energy levels that are different from those of the bulk material. These induced effects can give the composite useful optical, electrical, or physical properties, such as photoluminescence and super-paramagnetism. The resultant composite materials are useful for optical filters, lasers, or other active or passive optical, electrical, or magnetic devices.

DESCRIPTION OF THE PREFERRED EMBODIMENTS

The present invention provides an efficient and inexpensive process for the manufacture of aerogel composites with properties improved over pure aerogel materials. Carbon-silica composites with twice the thermal resistance of untreated aerogel at ambient temperatures will reduce the thickness requirement for the same thermal performance and will result in the commercial viability of aerogels as insulation in appliances such as refrigerators, freezers, water heaters, and ovens. Aerogel composites with improved performance at temperatures up to 500° C. will have applications in insulating steam and hot water pipes for industrial, commercial, and residential applications. Other medium-high-temperature applications include use in aircraft and aerospace insulation. New high-temperature automotive batteries will require high performance thermal insulation provided by aerogel composites. Composites of silicon and iron with silica or other aerogels will find use in electrical display devices, magnetic cooling cycles, gas-separation media, gas-phase catalysts, and optical devices.

The objectives of the present invention are carried out by a process which comprises introducing pre-selected gases and vapors into the aerogel, and decomposing those gases and vapors in situ to produce an aerogel with deposited decomposition products of the gases and vapors in the pores of the aerogel. Post-treatment processes may be used to add further components to the composite, selectively remove components from the composite, or alter the chemical or physical state of the composite.

Basically, the process involves the conventional steps of preparing an aerogel, and thereafter introducing into the heated aerogel a gas, which when decomposed in situ, deposits guest nanoscale material in the pore structure of the aerogel, as a result of the decomposition of the gas. Secondary or tertiary (etc.) composites are formed by infiltration of an additional gas(es) or vapor(s) followed by additional decomposition steps to add further decomposition product (s) into the aerogel-composite. Post-conditioning under controlled conditions (vacuum, inert or reactive gases, long-term controlled temperature or pressure, exposure to electromagnetic or other radiation) may be used, which may alter the chemical, physical, or optical properties of primary, secondary or tertiary (etc.) composites. The invention thus further includes the results of decomposing additional materials in composites made from the aerogels which have the decomposition products of the gases deposited within the aerogel pores, and the products made from the aerogels and/or aerogel composites which have further decomposition or other alteration products associated with any secondary or tertiary (etc.) treatments.

The process of this invention is carried out in a reaction vessel. The reaction vessel has inputs for three gas streams, but should not be considered to be limited to just three flows; any number could be connected. At least one reactant gas and one carrier gas is introduced into the reaction vessel. Each gas has a flowmeter connected between the cylinder and the reaction vessel. Also connected is a vessel capable of containing materials of sufficiently low vapor pressure that they can be introduced into the reaction vessel by heating causing them to vaporize and enter the carrier gas stream; more than one such vessel could be attached. The reaction vessel is constructed of a non-reactive material, usually glass, quartz, metal, ceramic, or ceramic-coated metal. The reaction vessel contains both inlet and outlet places such that gases pass effectively around and through the aerogel/aerogel composite reactant material. More than one inlet is conceivable. The aerogel sample, or in the case of secondary or tertiary reactions (etc.), a previously prepared composite material is placed in the reaction vessel. The reaction vessel is surrounded by temperature control elements, usually heating elements, but cooling units are possible. For post-conditioning, the reaction vessel can be evacuated, filled with non-reactive or other gases, or placed in another chamber allowing long-term temperature control, or exposure to electromagnetic or other radiation.

An alternative procedure to prepare aerogel composites is to place the aerogel starting material in a closed container that also contains a liquid or solid that will vaporize when activated by heat or radiation. The vessel may first be evacuated to remove air and left evacuated or back-filled with an inert or reacting gas. Then the vessel is heated or activated by radiation to vaporize the decomposable gases. The vapor infiltrates the aerogel and decomposes to form the aerogel composite.

In either procedure, the rate of deposition of the decomposition products of the gas onto the wall structure of the pores of the aerogel depends on the choice of gas and the temperature used.

Preferred gases for carbon deposition are methane, natural gas, commercial propane, acetylene, and vapors of xylene and furfuryl alcohol.

These gases all decompose to deposit carbon on the walls of the aerogel pore structures. Weight increases in the aerogel due to the deposition have been achieved from less that 1% to more than 800%. Deposition times vary from a few minutes to 48 hours or more.

After deposition, the aerogel exhibits a uniform deposition throughout the volume in some cases and non-uniform deposition in other cases. Long deposition times using a natural gas result in a dense graphite-like solid with considerably enhanced strength and resistance to attack by water. This material has a point-to-point electrical resistance as low as 1 ohm.

Preferred gases for Si deposition are the silanes and halogenate silanes; germanium hydrides for Ge deposition, and for Fe and Fe/C deposition the preferred gas is ferrocene [Fe($C_5H_5$)$_2$] or iron carbonyl. Similar organometallic substances, such as aryl chromium compounds, such as dibenzylchromium and others, or Cr(CO)$_6$, or nickel carbonyl, Ni(acac)$_2$ [nickel acetylacetonate], Ni($C_5H_5$)$_2$ [nickelocene], are preferred gases for deposition of Cr or Cr/C and Ni or Ni/C, respectively. Metal carbonyls of cobalt, molybdenum, tungsten, ruthenium, osmium, and manganese are preferred gases for the deposition of those elements or element/C composites, respectively. Ti($C_5H_5$)Cl$_2$ or V($C_5H_5$)$_2$ are preferred gases for the deposition of Ti or Ti/C and V or V/C, respectively. LiC or Li($C_5H_5$) would be a preferred choice for deposition of Li.

This process will be more fully understood by reference to the following examples, which are intended to be illustrative of the invention and not limiting thereof.

EXAMPLE 1.

Deposition of Carbon by Decomposition of Hydrocarbon Gases.

Small aerogel pieces were placed in a porcelain boat and loaded into a quartz-walled tube furnace. The furnace temperature was raised at a heating rate ranging from 5° to 20° C. per minute. An inert gas such as argon or nitrogen flowed into the reaction chamber initially and then the chosen hydrocarbon gas is introduced with or without a carrier gas once the desired deposition temperature has been reached. The deposition gas was introduced typically at a flow rate of 0.1 to 0.3 L/min for a few hours. After deposition, the darkened aerogel samples were cooled in inert atmosphere to prevent the oxidation of the deposited carbon.

Depending on the type of hydrocarbon gas used, the aerogels experienced a gradual darkening in color with increasing temperature and time. For example, in the case of natural gas (primarily methane, $CH_4$), the aerogels appeared clear at the beginning of deposition, turning tan when the deposition temperature reaches 700° C., brown at a deposition temperature of 730° C., dark brown at a deposition temperature of 750° C., and finally black at 770° C. As deposition proceeded, yellow to brown vapor was released from the quartz tube and liquid with a strong aromatic odor condensed on the effluent end of the quartz tube. On average, the weight of the aerogel doubled after deposition from flowing natural gas for about 5 hours although the deposition rate may change with time. The deposited carbon appeared to be distributed quite uniformly throughout the volume of the aerogel.

As expected, acetylene gas required a much lower temperature to decompose than did natural gas, depositing black carbon in aerogels at temperatures as low as 500° C. or less if a carbon was introduced into the aerogels earlier. It took less than an hour to double the weight of the aerogel indicating a faster deposition rate. Other hydrocarbon gases evaluated include pure methane, having an optimum deposition temperature of 850° C., and commercial propane with an optimum deposition temperature at 700° C.

EXAMPLE 2.

Deposition of Carbon by Decomposition of Vapors of Hydrocarbons that are in Condensed Phases at Room Temperature Hydrocarbon liquids, such as xylene and furfuryl alcohol, provide another alternative for the deposition of carbon in silica aerogels. They were introduced into the reaction chamber either as vapors or liquid droplets using a carrier gas. The deposition temperature varied from 450° C. for xylene to 350° C. for furfuryl alcohol. After deposition, further treatment in an inert atmosphere at a higher temperature (>650° C.) was necessary in order to completely convert the hydrocarbon to carbon.

EXAMPLE 3.

Deposition of Silicon by Decomposition of Silane or Trichlorosilane

Silane, diluted to a concentration of 1.9% in argon for safety purposes, was introduced at a flow rate of 0.05 to 0.3 L/min, decomposing to brown silicon in silica aerogels at deposition temperatures as low as 450° C. But the deposition was far from uniform, being richer near the surface region of the aerogel. The uniformity was improved somewhat when hydrogen gas was added at a high flow rate to reduce the rate of the decomposition of silane.

Trichlorosilane is another source for the deposition of silicon in aerogels. Trichlorosilane, introduced by its own vapor or by bubbling argon (0.2 L/min) through it, decomposed to light brown silicon particles in the aerogel matrix at 550° C. More than 10% weight increase was achieved after depositing for only 1 hr. The aerogel became opaque and light brown, but the deposition appeared much more homogenous than that from the decomposition of silane.

Samples of silicon/silica aerogel composite became luminescent (under ultraviolet light) after being annealed in an inert atmosphere at temperatures above 700° C. and preferably aged at about 120° C. for a few hours.

EXAMPLE 4.
Deposition of Iron by Decomposition of Ferrocene

Ferrocene, $Fe(C_5H_5)_2$, though solid at room temperature, boils at 245° C. and has sufficient vapor pressure for deposition into aerogels when heated to about 100° C. Ferrocene vapor was transported by dry nitrogen at a flow rate of 0.1 L/min to the quartz reaction chamber, where it decomposed to finely divided iron/carbon particles throughout the aerogel. Alternatively, a container with ferrocene can be placed in a closed, evacuated chamber containing aerogel and heated to 100°–200° C. Depending on the quantity of material deposited, the samples were pyrophoric and glowed when exposed to air or oxygen, leaving a dark brown iron compound which was magnetic or paramagnetic. The weight increase was nearly 100% after deposition of 24 hours at 400° C. The color of the composite material changed from brown to light green upon heating in a reducing atmosphere, e.g. hydrogen to 450° C. Further heating to 700° C. in a reducing atmosphere results in a black material that has undergone considerable shrinkage. Exposure to air of the green material results in a composite that is black at ambient temperature and brown at relatively high temperatures (400°–500° C.).

EXAMPLE 5.
Decomposition of Ferrocene in a Closed Chamber

Solid ferrocene and silica aerogel were placed in a closed container that was either evacuated, or evacuated and backfilled with helium, at a pressure that ranges from a few hundred milli-torr to a few hundred torr. The container was heated to 100 to 200° C. for several hours. The resulting material contains very small carbon rings and tubes in addition to amorphous carbon and iron deposits.

What is claimed is:

1. A process of forming an aerogel composite, which process comprises:

introducing a reactive gaseous material at 100° C. or higher into the pores of a formed aerogel monolith or powder having a pore structure, and causing decomposition at 100° C. or higher of said gaseous material on and within the pores of said aerogel in amounts sufficient to cause deposition of solid decomposition products of said gaseous material on the surface of the pores of said aerogel and for a sufficient time between a few minutes and 48 hrs to create an aerogel suitable for thermal insulation, photolytic catalysis, electrical battery electrode, luminescent functions, paramagnetic functions, superparamagnetic functions or ferromagnetic functions, wherein additional gas or vapor is introduced into the composite material, depositing within or reacting with the composite, forming yet another composite.

2. The method in claim 1, wherein said gaseous material is introduced into said aerogel in amounts sufficient to cause an increase in weight of the aerogel of from about 0.1% to 800 %.

3. The process of claim 1, wherein the materials formed therein are exposed to post-conditioning in which they are placed in a vacuum or in an inert atmosphere for a specified period of time, during which said composite undergoes physical or chemical transformation.

4. The process of claim 1, wherein the materials formed therein are exposed to post-conditioning in which they are placed in a vacuum or in an inert atmosphere for a specified period of time, and exposed to electromechanical treatment or radiation such that the said composite undergoes physical or chemical transformation.

5. The process of claim 1, wherein the materials formed therein are exposed to post-conditioning in which they are placed in a reactive atmosphere for a specified period of time, such that the said composite undergoes physical or chemical transformation.

6. The process of claim 1, wherein the materials formed therein are exposed to post-conditioning in which they are placed in a reactive atmosphere for a specified period of time, and exposed to electrical treatment or radiation such that the said composite undergoes physical or chemical transformation.

7. The process of claim 1, wherein said gaseous material is selected from the group consisting of methane, natural gas, commercial propane, reagent grade propane, acetylene, xylene, furfuryl alcohol, silane, disilane, methyl silane, trimethyl silane, tetramethyl silane, tetrakisdimethylamino silane, trichlorosilane, halogenated silanes, germanium hydrides, ferrocene, iron carbonyl, nickel carbonyl, nickelocene, $Ni(acac)_2$, dibenzylchromium, aryl chromium compounds, chromium carbonyl, nickel carbonyl, cobalt carbonyl, molybdenum carbonyl, tungsten carbonyl, ruthenium carbonyl, osmium carbonyl, manganese carbonyl, $Ti(C_5H_5)Cl_2$, $Ti(CH_3)(C_7H_7)$ $B(OMe)_3$, aryl boranes, metallo carboranes, carboranes, $V(C_5H_5)_2$, LiC, $Li(C_5H_5)$, and any other compounds or elements with a vapor pressure that permits deposition of the gaseous material as a solid decomposition product in the pores of or on the aerogel.

8. The method of claim 1, wherein the decomposition of said gaseous material takes place at temperatures from about 100° to about 1000° C.

9. A process of forming an aerogel composite, which process comprises:

introducing a reactive gaseous material at 100° C. or higher into the pores of a formed aerogel monolith or powder having a pore structure, and causing decomposition at 100° C. or higher of said gaseous material on and within the pores of said aerogel in amounts sufficient to cause deposition of solid decomposition products of said gaseous material on the surface of the pores of said aerogel and for a sufficient time to create an aerogel suitable for thermal insulation, photolytic catalysis, electrical battery, electrode, luminescent functions, paramagnetic functions, superparamagnetic functions or ferromagnetic functions, in which reactive additional gas or vapor is introduced into the composite material, depositing within or reacting with the composite, forming yet another composite.

10. The process of claim 9, wherein the materials formed therein are exposed to post-conditioning in which they are placed in a vacuum or in an inert atmosphere for a specified period of time, during which said composite undergoes physical or chemical transformation.

11. The process of claim 9, wherein the materials formed therein are exposed to post-conditioning in which they are placed in a vacuum or in an inert atmosphere for a specified period of time, and exposed to electromechanical treatment or radiation such that the said composite undergoes physical or chemical transformation.

12. The process of claim 9, wherein the materials formed therein are exposed to post-conditioning in which they are placed in a reactive atmosphere for a specified period of time, such that the said composite undergoes physical or chemical transformation.

13. The process of claim 9, wherein the materials formed therein are exposed to post-conditioning in which they are placed in a reactive atmosphere for a specified period of time, and exposed to electrical treatment or radiation such that the said composite undergoes physical or chemical transformation.

14. The process of claim 9, wherein said gaseous material is selected from the group consisting of methane, natural gas, commercial propane, reagent grade propane, acetylene, xylene, furfuryl alcohol, silane, disilane, methyl silane, trimethyl silane, tetramethyl silane, tetrakisdimethylamino silane, trichlorosilane, halogenated silanes, germanium hydrides, ferrocene, iron carbonyl, nickel carbonyl, nickelocene, Ni (acac)$_2$, dibenzylchromium, aryl chromium compounds, chromium carbonyl, nickel carbonyl, cobalt carbonyl, molybdenum carbonyl, tungsten carbonyl, ruthenium carbonyl, osmium carbonyl, manganese carbonyl, Ti($C_5H_5$)$CL_2$, Ti($CH_3$)($C_7H_7$)B(OMe)$_3$, aryl boranes, metallo carboranes, carboranes, V($C_5H_5$)$_2$, LiC, Li($C_5H_5$), and any other compounds or elements with a vapor pressure that permits deposition of the gaseous material as a solid decomposition product in the pores of or on the aerogel.

15. The method of claim 9, wherein the decomposition of said gaseous material takes place at temperatures from about 100° to about 1000° C.

16. The method in claim 9, wherein said gaseous material is introduced into said aerogel in amounts sufficient to cause an increase in weight of the aerogel of from about 0.1% to 800%.

* * * * *